United States Patent
Hutton

(10) Patent No.: US 11,194,947 B2
(45) Date of Patent: Dec. 7, 2021

(54) SYSTEMS AND METHODS FOR REGION-BASED ERROR DETECTION AND MANAGEMENT IN INTEGRATED CIRCUITS

(71) Applicant: Intel Corporation, Santa Clara, CA (US)

(72) Inventor: Michael David Hutton, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 922 days.

(21) Appl. No.: 15/717,655

(22) Filed: Sep. 27, 2017

(65) Prior Publication Data

US 2019/0095570 A1    Mar. 28, 2019

(51) Int. Cl.
| | |
|---|---|
| *G06F 11/00* | (2006.01) |
| *G06F 30/392* | (2020.01) |
| *G06F 11/14* | (2006.01) |
| *G06F 11/07* | (2006.01) |
| *G06F 30/34* | (2020.01) |

(52) U.S. Cl.
CPC ........ *G06F 30/392* (2020.01); *G06F 11/0751* (2013.01); *G06F 11/0793* (2013.01); *G06F 11/1417* (2013.01); *G06F 30/34* (2020.01); *G06F 2201/805* (2013.01)

(58) Field of Classification Search
CPC .............. G06F 30/392; G06F 11/0766; G06F 11/0751; G06F 11/0793
See application file for complete search history.

(56) References Cited

U.S. PATENT DOCUMENTS

| | | | | |
|---|---|---|---|---|
| 7,263,678 B2* | 8/2007 | Byrn | ..................... | G06F 30/392 716/113 |
| 9,477,807 B1* | 10/2016 | Harper | ................... | G06F 30/327 |
| 2006/0218515 A1* | 9/2006 | Byrn | ..................... | G06F 30/392 716/113 |
| 2011/0023000 A1* | 1/2011 | Dirks | ..................... | G06F 30/392 716/122 |
| 2012/0110537 A1* | 5/2012 | Vedantam | ............. | G06F 30/394 716/129 |

(Continued)

OTHER PUBLICATIONS

2019 Revised Patent Subject Matter Eligibility Guidance Appendix 1 pp. 30-41 (Year: 2019).*

*Primary Examiner* — Jonathan D Gibson
(74) *Attorney, Agent, or Firm* — Fletcher Yoder, P.C.

(57) ABSTRACT

Systems and methods for detecting and managing errors in integrated circuits are provided. In one example, a system includes an integrated circuit that includes configuration memory that defines a circuit design implemented by the integrated circuit. The circuit design includes a plurality of regions. Additionally, the system is configured to determine a physical location of an error in the configuration memory and determine a location in a floorplan of the configuration memory that corresponds to the physical location of the error in the configuration memory. The floorplan identifies where the plurality of regions are defined in the configuration memory. The system is configured to determine in which of the plurality of regions the error in the configuration memory has occurred based at least in part on the location in the floorplan. Also, the system is configured to perform a corrective operation based on the location in the floorplan.

20 Claims, 6 Drawing Sheets

(56) References Cited

U.S. PATENT DOCUMENTS

| | | | |
|---|---|---|---|
| 2013/0258751 A1* | 10/2013 | Toops | G06F 30/39 |
| | | | 365/145 |
| 2017/0124238 A1* | 5/2017 | Teper | G06F 21/556 |
| 2018/0046746 A1* | 2/2018 | Clevenger | G06F 30/30 |
| 2018/0300442 A1* | 10/2018 | Izumi | G06F 30/327 |
| 2019/0095570 A1* | 3/2019 | Hutton | G06F 11/1417 |

* cited by examiner

SYSTEMS AND METHODS FOR REGION-BASED ERROR DETECTION AND MANAGEMENT IN INTEGRATED CIRCUITS

BACKGROUND

The present disclosure relates generally to classifying and managing errors in an integrated circuit device by spatial location.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Programmable logic devices are a class of integrated circuits that can be programmed to perform a wide variety of operations. A programmable logic device may include programmable logic elements programmed by a form of memory known as configuration random access memory (CRAM). Thus, to program a circuit design into a programmable logic device, the circuit design may be compiled into a bitstream and programmed into CRAM cells. The values programmed into the CRAM cells define the operation of programmable logic elements of the programmable logic device.

As such, any change in the values stored in the CRAM cells can affect the operation of the programmable logic device. Yet the values stored in the CRAM cells may change undesirably under certain conditions, such as by device tampering or single event upsets (SEUs). Single event upsets occur when ionizing radiation strikes (e.g., from cosmic rays) discharge the charge in the storage of the CRAM cells. As programmable logic devices increasingly include higher densities of CRAM cells, SEUs are becoming increasingly more common. In some instances, detection of an undesirable change in the values stored in the CRAM (e.g., detection of a SEU) may result in the rebooting of the programmable logic device. Even if the reboots occur rarely on any single programmable logic device, these reboots could produce a measurable performance impact across numerous programmable logic devices in the aggregate.

SUMMARY

Certain aspects commensurate in scope with the originally claimed disclosure are set forth below. It should be understood that these aspects are presented merely to provide the reader with a brief summary of certain forms of the disclosure might take and that these aspects are not intended to limit the scope of the disclosure. Indeed, the disclosure may encompass a variety of aspects that may not be set forth below.

To classify and manage errors in values stored on CRAM cells, thereby reducing the number of reboots that may take place, a floorplan of regions of an integrated circuit, such as a programmable logic device, and a physical representation of a CRAM address lookup may be utilized. By utilizing a floorplan of the regions and a physical representation of the CRAM address lookup, errors in values stored on the CRAM may be rapidly identified and classified. Furthermore, based on the identified error(s), a management system may manage (e.g., correct) errors in the values stored on the CRAM.

In one example, an integrated circuit that includes configuration memory may determine a physical location of an error in the configuration memory, determine a location in a floorplan that corresponds to the physical location of the error, and correct the error based on the location on the floorplan. For instance, the floorplan may include various regions, the integrated circuit may determine that the physical location of the error in the configuration memory corresponds to a location in the floorplan that is located in a particular region, and the integrated circuit may perform a corrective operation based on the error being locating in the particular region. Because corrective actions may be made based on a location in the floorplan, errors are less likely to be corrected by rebooting the integrated circuit. For example, in several cases, the error may be remedied by restoring configuration memory that is associated with location in a region on the floorplan that corresponds to the physical location of the error in the configuration memory.

Various refinements of the features noted above may be made in relation to various aspects of the present disclosure. Further features may also be incorporated in these various aspects as well. These refinements and additional features may be made individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Advantages of the disclosure may become apparent upon reading the following detailed description and upon reference to the drawings in which.

DETAILED DESCRIPTION OF SPECIFIC EMBODIMENTS

Figure 1:
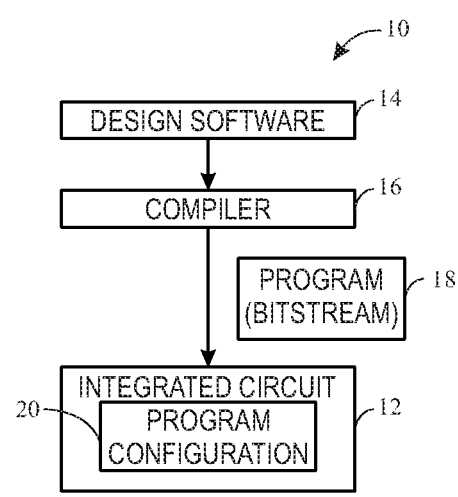
FIG. 1 is a block diagram of a system that may classify and correct errors associated with configuration memory, in accordance with an embodiment of the present disclosure.

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

This disclosure relates to error classification and correction of configuration random access memory (CRAM) cells that may store configuration values of a programmable logic device fabric. Changes in the values stored in the CRAM cells can affect the operation of the programmable logic device. Yet the values stored in the CRAM cells may change undesirably under certain conditions, such as by device tampering or single event upsets (SEUs). Single event upsets occur when ionizing radiation strikes (e.g., from cosmic rays) discharge the charge in the storage of the CRAM cells. As programmable logic devices increasingly include higher densities of CRAM cells, SEUs are becoming increasingly more common.

To confirm that the CRAM cells contain proper values, and thereby confirm the desired operation of the programmable logic device, the values stored on the CRAM cells may occasionally be read. Additionally, improper values in the CRAM cells may cause the programmable logic device to operation as desired. In many cases when an improper value is stored on a CRAM cell, the programmable logic device may be rebooted to correct the improper value. However, rebooting the programmable logic device may be undesirable for several reasons. For example, performing a reboot may take an undesirable amount of time.

Furthermore, identifying and/or classifying a detected error in the values of CRAM cells typically calls for performing a lookup of all CRAM cells associated with the programmable logic device. Such a lookup may take an undesirable amount of time. For instance, the lookup may be performed on a relatively large file (e.g., several megabytes of data) and/or the file may not be stored on the programmable logic device.

To classify and manage errors in values stored on CRAM cells, a floorplan of partial reconfiguration regions a programmable logic device and a physical representation of a CRAM address lookup may be utilized. By utilizing a floorplan of the partial reconfiguration regions and a physical representation of the CRAM address lookup, errors in values stored on the CRAM may be quickly identified and classified. Furthermore, based on the identified error(s), a management system may manage (e.g., correct) errors in the values stored on the CRAM.

With the foregoing in mind, FIG. 1 illustrates a block diagram of a system 10 that may classify and correct errors associated with configuration memory. A designer may implement functionality on an integrated circuit, such as a reconfigurable integrated circuit 12, such as a field programmable gate array (FPGA). The designer may implement a circuit design to be programmed onto the integrated circuit 12 using design software 14, such as a version of Quartus by Intel™. The design software 14 may use a compiler 16 to generate a low-level circuit-design program (bitstream) 18, sometimes known as a program object file, that programs the integrated circuit 12. That is, the compiler 16 may provide machine-readable instructions representative of the circuit design to the integrated circuit 12. For example, the integrated circuit 12 may receive one or more programs (bitstreams) 18 that describe the hardware implementations that should be stored in the integrated circuit 12. The programs (bitstreams) 18 may programmed into the integrated circuit 12 as a configuration program 20. As discussed below, the programs (bitstreams) 18 may include static regions and partial reconfiguration regions.

Figure 2:
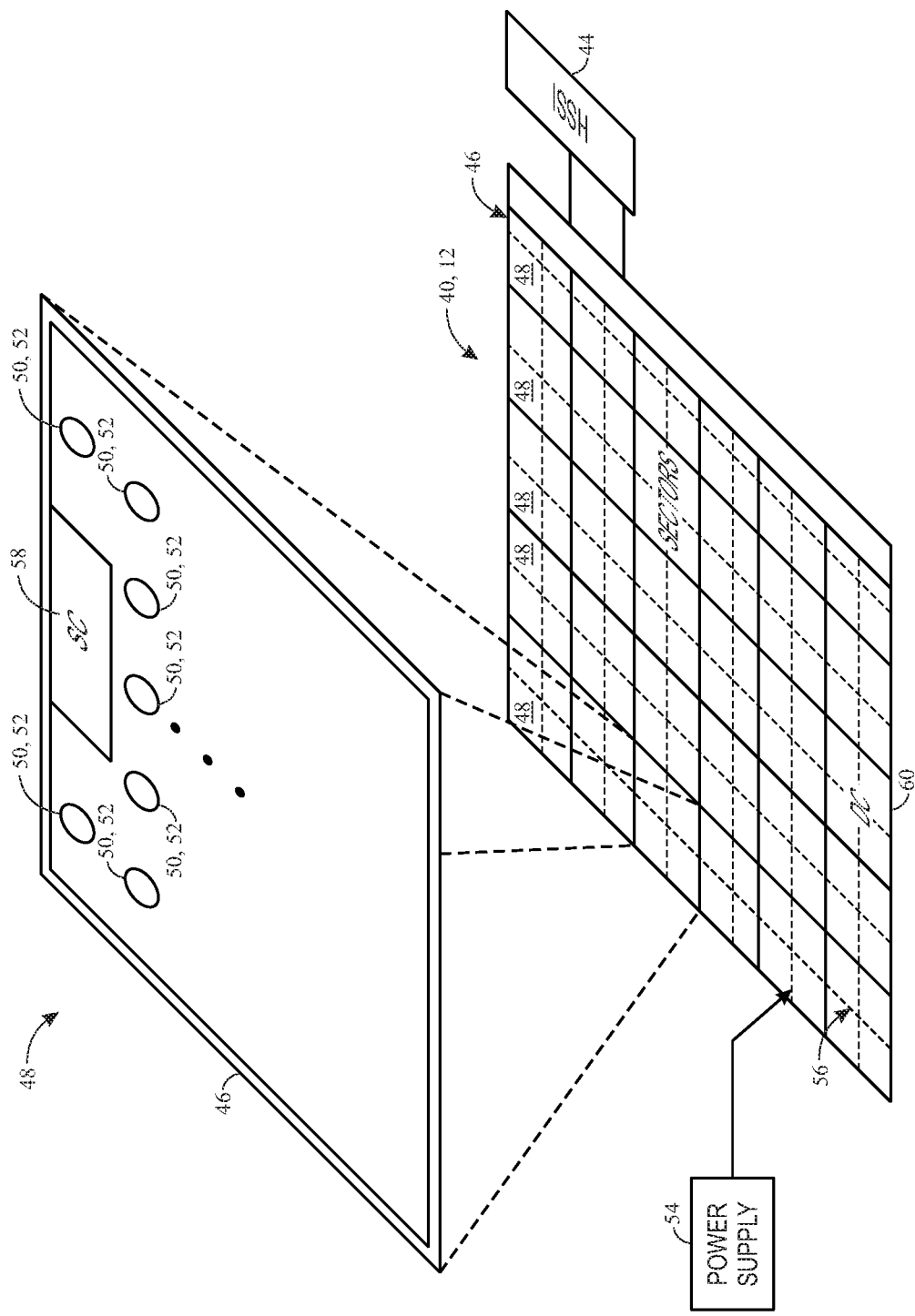
FIG. 2 is a block diagram of an integrated circuit that includes multiple sectors of programmable logic, in accordance with an embodiment of the present disclosure.

The integrated circuit 12 may be a programmable logic device, such as a field programmable gate array (FPGA) 40, as shown in FIG. 2. For the purposes of this example, the FPGA 40 is referred to as an FPGA, though it should be understood that the device may be any suitable type of programmable logic device (e.g., an application-specific integrated circuit and/or application-specific standard product). In one example, the FPGA 40 is a sectorized FPGA of the type described in U.S. patent application Ser. No. 14/460,548, "Programmable Circuit Having Multiple Sectors," which is incorporated by reference in its entirety for all purposes.

In the example of FIG. 2, the FPGA 40 may include transceiver circuitry 44 for driving signals off of the FPGA 40 and for receiving signals from other devices. Interconnection resources 46 may be used to route signals, such as clock or data signals, through the FPGA 40. The FPGA 40 of FIG. 2 is sectorized, meaning that programmable logic resources may be distributed through a number of discrete programmable logic sectors 48. Each programmable logic sector 48 may include a number of programmable logic elements 50 having operations defined by configuration memory 52 (e.g., configuration random access memory (CRAM)). The programmable logic elements 50 may include combinational or sequential logic circuitry. For example, the programmable logic elements 50 may include look-up tables, registers, multiplexers, routing wires, and so forth. A designer may program the programmable logic elements 50 to perform a variety of desired functions. A power supply 54 may provide a source of voltage and current to a power distribution network (PDN) 56 that distributes electrical power to the various components of the FPGA 40. Operating the circuitry of the FPGA 40 causes power to be drawn from the power distribution network 56.

There may be any suitable number of programmable logic sectors 48 on the FPGA 40. Indeed, while 29 programmable logic sectors 48 are shown here, it should be appreciated that more or fewer may appear in an actual implementation (e.g., in some cases, on the order of 50 to 100 sectors or more). Each programmable logic sector 48 may include a sector controller (SC) 58 that controls the operation of the programmable logic sector 48. Each sector controller 58 may be in communication with a device controller (DC) 60. Each sector controller 58 may accept commands and data from the device controller 60, and may read data from and write data into its configuration memory 52 based on control signals from the device controller 60. In addition to these operations, the sector controller 58 may be augmented with numerous additional capabilities. For example, such capabilities may include locally sequencing reads and writes to implement error detection and correction on the configuration memory 52 and sequencing test control signals to effect various test modes.

The sector controllers 58 and the device controller 60 may be implemented as state machines and/or processors. For example, each operation of the sector controllers 58 or the device controller 60 may be implemented as a separate routine in a memory that includes a control program. This control program memory may be fixed in a read-only memory (ROM) or stored in a writable memory, such as random access memory (RAM). The ROM may have a size larger than would be used to store only one copy of each routine. This may allow each routine to have multiple variants depending on "modes" the local controller may be placed into. When the control program memory is implemented as RAM, the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

Each sector controller 58 thus may communicate with the device controller 60, which may coordinate the operations of the sector controllers 58 and convey commands initiated from outside the FPGA device 40. To support this communication, the interconnection resources 46 may act as a network between the device controller 60 and each sector controller 58. The interconnection resources 46 may support a wide variety of signals between the device controller 60 and each sector controller 58. For example, these signals may be transmitted as communication packets.

The FPGA 40 may be electrically programmed. With electrical programming arrangements, the programmable logic elements 50 may include one or more logic elements (wires, gates, registers, etc.). For example, during programming, configuration data may be loaded into the configuration memory 52 using input/output pins and input/output circuitry. In one example, the configuration memory 52 may be implemented as configuration random-access-memory (CRAM) cells. The use of configuration memory 52 based on RAM technology described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may be applied to the gates of metal-oxide-semiconductor (MOS) transistors that control the states of the programmable logic elements 50 or programmable components of the interconnection resources 46.

Figure 3:
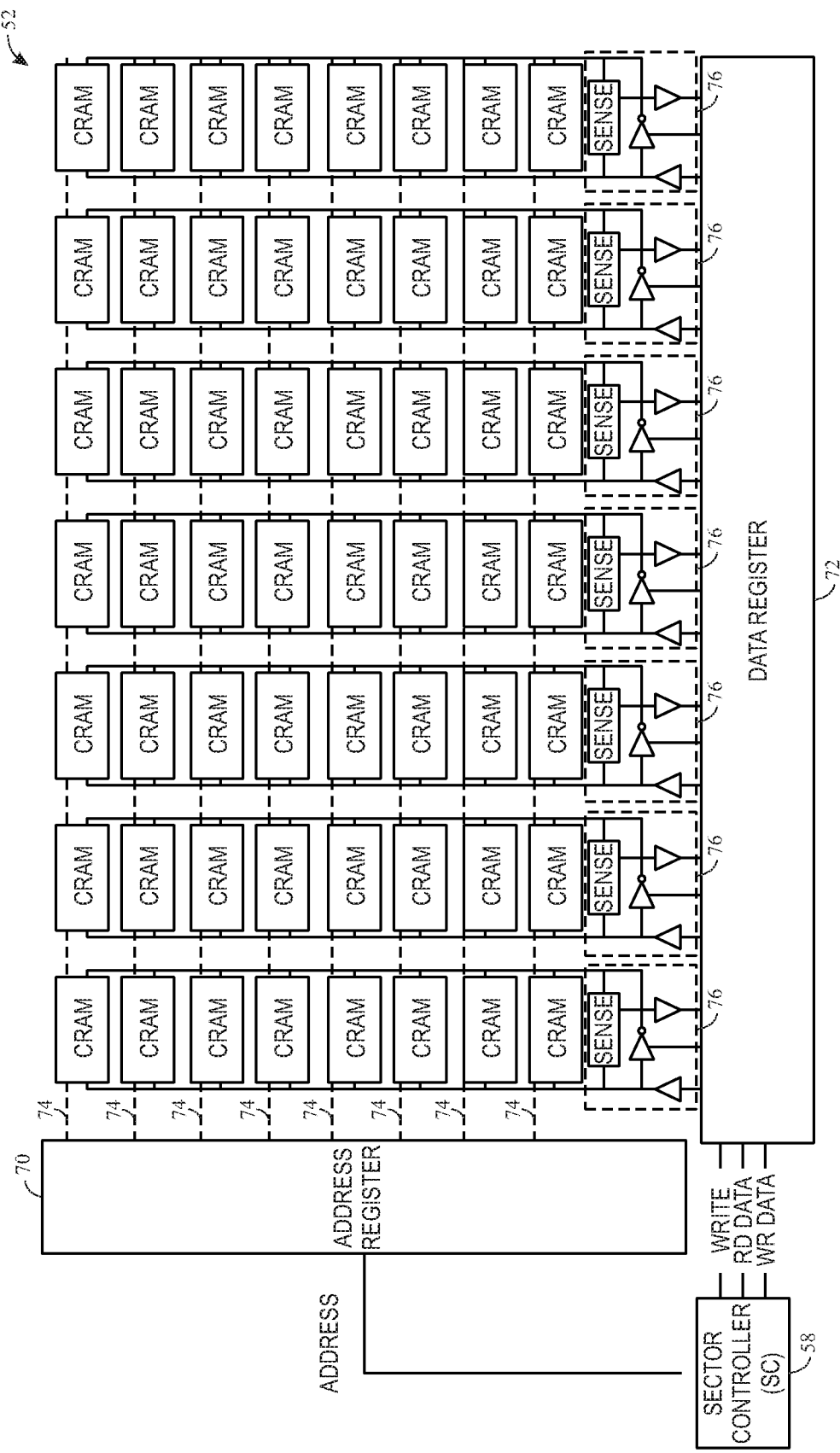
FIG. 3 is a block diagram of configuration random access memory (CRAM) that may program the operation of the programmable logic, in accordance with an embodiment of the present disclosure.

A simplified example of the configuration memory 52 of one of the programmable logic sectors 48 appears in FIG. 3. The sector controller 58 of the programmable logic sector 48 is shown to read and write to the CRAM (i.e., configuration memory 52) by providing an ADDRESS signal to an address register 70 and providing a memory write signal (WRITE), a memory read signal (RD DATA), and/or the data to be written (WR DATA) to a data register 72. These signals may be used to cause the data register 72 to write data to or read data from a line of configuration memory 52 that has been activated along an address line 74, as provided by the ADDRESS signal applied to the address register 70. Memory read/write circuitry 76 may be used to write data into the activated configuration memory 52 cells when the data register 72 is writing data, and may be used to sense and read data from the activated configuration memory 52 cells when the data register 72 is reading data.

Figure 4:
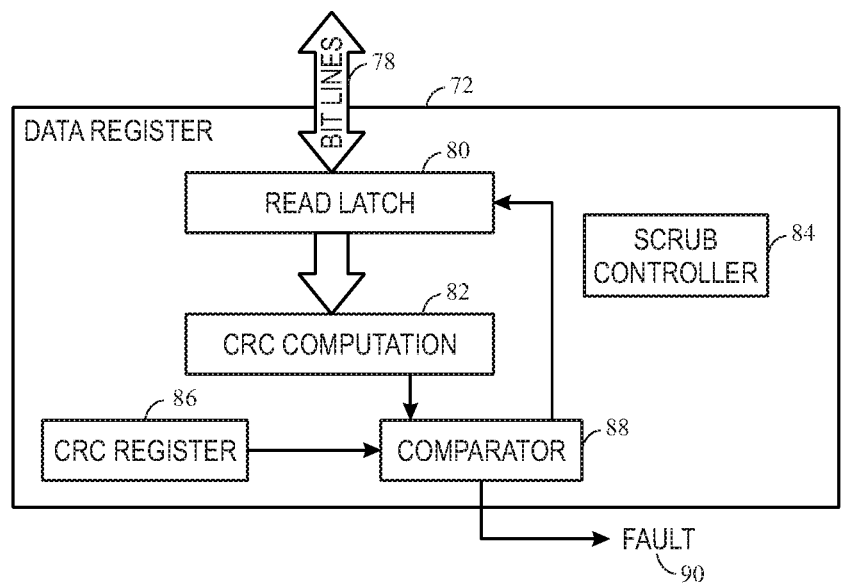
FIG. 4 is a block diagram of circuitry that may detect and correct errors due to single-event upsets (SEUs) or tampering, in accordance with an embodiment of the present disclosure.

Reading the configuration memory 52 allows for error detection and correction for errors arising from single-event upsets (SEUs) or tampering. Because the structure of the configuration program 20 is stored the configuration memory 52, an SEU or tampering may alter the configuration program 20 and hence the functionality of the FPGA 40. As such, SEU mitigation is a consideration for programmable circuits, such as FPGAs. To address this issue, the configuration memory 52 may be read occasionally (e.g., periodically or substantially continuously), and various error checking techniques may detect and correct errors in the configuration memory 52. Updates may be written back into the configuration memory 52 to correct for these errors as desired. FIG. 4 depicts an illustrative embodiment of such circuitry. In one example, the data register 72 may receive bit lines 78 from the configuration memory 52 into a read latch or latches 80. A cyclic redundancy check (CRC) computation block 82, which may be controlled by a scrub controller 84, may compute a current CRC value that is compared to an expected CRC value from a CRC register 86. When these are compared in a comparator 88, any deviation may signal a fault 90. The fault 90 may indicate that an error has arisen somewhere in the configuration memory 52 and allow the sector controller 58, the device controller 60, or the scrub controller 84 to take action in response. For example, detected errors may be corrected by restoring the configuration memory 52 using a previously stored copy of the data or other redundant information. Additionally, the fault 90 may be indicative of a specific physical location of the error in the configuration memory 52. The physical location of the error may be determined by the sector controller 58, device controller 60, and/or the scrub controller 84. As discussed below, corrective operations may be performed based on a position on a floorplan of an integrated circuit 12 (e.g., the FPGA 40) that corresponds to the physical location of the error in the configuration memory 52.

Figure 5:
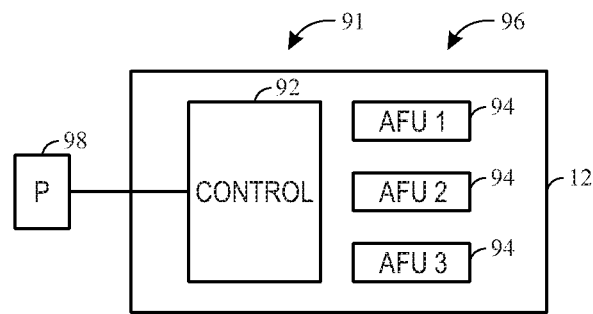
FIG. 5 is a block diagram of a system that includes an integrated circuit, in accordance with an embodiment of the present disclosure.

As discussed above, the integrated circuit 12 may receive one or more programs (bitstreams) 18 that are implemented onto the integrated circuit 12 as a configuration program 20. FIG. 5 is a block diagram of a system 91 that includes an embodiment of the integrated circuit 12 that includes several different regions. The regions may correspond to the programs (bitstreams) 18. For example, the integrated circuit 12 may include a static region 92 and several partial reconfiguration regions 94. While the illustrated embodiment shows a single static region 92 and several partial reconfiguration regions 94, it should be noted the integrated circuit 12 may include any suitable number of static regions 92 and partial reconfiguration regions 94. The regions (e.g., static region 92 and partial configuration regions 94) of the integrated circuit 12 may be programmed and/or designed by various parties. For example, the regions may be programmed and/or designed by the maker of the integrated circuit 12, the user (i.e., user-defined), a third-party, or a combination thereof. The static region 92 corresponds to area on the integrated circuit 12 that is typically not configured to be reconfigured (i.e., reprogrammed). The partial reconfiguration regions 94 correspond to areas on the integrated circuit 12 that can be modified (i.e., partially reconfigured) to implement new logic.

The various regions of the integrated circuit 12 may correspond to different functions associated with the integrated circuit 12. For example, in the illustrated embodiment, the static region 92 is associated with control functions associated with the integrated circuit 12. For instance, the static region 92 may interface with another processor 98 that controls the integrated circuit 12 and/or other integrated circuits. Additionally, in the illustrated embodiment, the partial reconfiguration regions 94 correspond to accelerator functional units, which may be utilized to perform designated functions. For example, each of the partial reconfiguration regions 94 may perform certain calculations that are defined by a user via the design software 14.

While FIG. 5 illustrates an embodiment of the integrated circuit 12, it should also be noted that FIG. 5 also pertains to a floorplan 96 of the integrated circuit 12. The floorplan 96 is representative of, and corresponds to, the physical configuration of the integrated circuit 12. For example, as discussed above, the regions (e.g., static region 92 and partial reconfiguration regions 94) may correspond to programs (bitstreams) 18 that are generated by a compiler 16 associated with the design software 14, and the programs (bitstreams) 18 may describe hardware implementations to be stored on the integrated circuit 12. The floorplan 96 corresponds to such hardware implementations. In other words, the floorplan 96 corresponds to the physical hardware implementations (i.e., circuit design) of the integrated circuit 12. For example, the floorplan 96 may be a digital representation that is identical or similar to the physical hardware implementations that are described by the programs (bitstreams) 18 and the circuit design implemented on the integrated circuit 12. More specifically, the floorplan 96 may include coordinates (e.g., x and y coordinates) that correspond to the static region 92 and partial reconfiguration regions 94. Furthermore, the coordinates may define boundaries of shapes (e.g., rectangles) that are representative of the physical hardware implementations of the integrated circuit 12. The floorplan 96 may be generated by the compiler 16 and stored in memory of the integrated circuit 12. More specifically, the floorplan 96 may be stored on twenty or fewer kilobytes of memory located within the static region 92. In other embodiments, the floorplan may be stored on an amount of the memory within the static region 92 that is equal to or greater than twenty kilobytes, such as fifty kilobytes. Because the floorplan 96 is stored on the memory of the integrated circuit 12 and occupies a small amount of memory, the floorplan 96 is readily accessible by the components of the integrated circuit 12 and can be rapidly scanned or utilized in another suitable manner.

The floorplan 96 and physical hardware implementations of the integrated circuit 12 may be utilized in the classification and management of errors (e.g., SEUs) associated with the integrated circuit 12. For example, when an error (e.g., the fault 90) is detected (e.g., via cyclic redundancy checking), a location on the floorplan 96 corresponding to the physical location of the error on the integrated circuit 12 may be determined via the sector controller 58, the device controller 60, the scrub controller 84, control region (i.e., static region 92), and/or another processor that is communicatively coupled to the integrated circuit 12 (e.g., processor 98). In other words, when an error is detected during a cyclic redundancy check or via another suitable technique, a coordinate location on the floorplan 96 that corresponds to the physical location of the error (e.g., a particular location in the configuration memory 52 (e.g., CRAM cell)) that stores a value that differs from the expected value from the CRC register 86) may be determined. Such a determination may be made in real-time or near real-time.

The corresponding location on the floorplan 96 (e.g., a set of coordinates) may be utilized in the classification and management of the error. For example, if the error were to occur on configuration memory 52 in one of the partial reconfiguration regions 94 (e.g., AFU 1), the corresponding coordinates of the error location on the floorplan 96 may be determined via the static region (i.e., control region) 92 and/or the processor 98, and the error may be classified as being an error in AFU 1. In other words, the coordinates of the floorplan 96 are utilized in conjunction with the physical location on the integrated circuit 12 where the error is present. Based on the coordinates of the floorplan 96 that correspond to the physical location of the error, the location of the error may be determined (i.e., classified). While the previous example is directed to on the partial reconfiguration regions 94, it should be noted that this technique may be used to determine the corresponding region of the error for any region of the integrated circuit 12 or that the error did not occur in configuration memory 52 associated with a region. For instance, the physical location of the detected error may be in the static region 92, any of the partial reconfiguration regions 94, or in a location that is neither in the static region 92 nor one of the partial reconfiguration regions 94. In any case, a set of coordinates (e.g., a point defined by an x coordinate and a y coordinate) on the floorplan 96 may be determined based on the physical location of the error, and whether the detected error location pertains to the static region 92, one of the partial reconfiguration regions 94 or neither the static region 92 nor one of the partial reconfiguration regions 94 may be ascertained.

Based the determined coordinates of the floorplan 96, the error may be managed. For example, software that may be implemented by the integrated circuit 12 and/or a processor communicatively coupled to the integrated circuit 12 (e.g., processor 98) may include instructions for managing the error. Regarding the illustrated embodiment, as mentioned above, the coordinates of the floorplan 96 correspond to the physical location of the detected error, thus the coordinates of the floorplan 96 correspond to the static region 92, one of the partial reconfiguration regions 94 or neither the static region 92 nor any of the partial reconfiguration regions 94. Error management software may include instructions that, when executed, cause various determinations and/or actions to be performed based on the determined coordinates of the floorplan 96 (i.e., the coordinates that correspond to the physical location of the error on the integrated circuit 12). For instance, if the error is determined to have occurred in a partial reconfiguration region 94, it may be determined whether the partial reconfiguration region 94 is active (e.g., performing a calculation or task). If the partial reconfiguration region 94 is not active, the configuration memory 52 of the error may be restored using a previously stored copy of data (e.g., a value stored on the CRC register 86). This process (i.e., restoring configuration memory 52 using previously stored data) is hereinafter referred to as "scrubbing." Additionally, the occurrence of the error may be logged (i.e., stored in memory), and/or the partial reconfiguration region 94 may be reset (e.g., a logical reset) after scrubbing.

Continuing with the example in which the error is determined to have occurred in a partial reconfiguration region 94, if the partial reconfiguration region 94 is active, an error management action may be taken based on an error policy associated with the partial reconfiguration region 94. For example, each partial reconfiguration region 94 may be associated with an error policy that specifies the corrective operation to be taken in the event an error occurs in the particular partial reconfiguration region 94 while the partial reconfiguration region 94 is active. In the illustrated embodiment, the error policy may call for the error to be scrubbed or for the partial reconfiguration region 94 to be rebooted (described below). In instances in which the error is scrubbed, the error may be scrubbed as described above, the occurrence of the error may be logged (i.e., stored in memory), and/or the partial reconfiguration region 94 may be reset after scrubbing. In instances in which the partial reconfiguration region 94 is rebooted, the partial reconfiguration region 94 may cease operations (i.e., stop being active), configuration memory 52 associated with the partial reconfiguration region 94 may be cleared and rewritten, and/or a notification indicative of the reboot may be sent to static region 92 and/or the processor 98. It should be noted that in the case of a reboot, each CRAM cell of the configuration memory 52 may be rewritten. That is, in contrast to the scrubbing of a non-active partial reconfiguration region 94 described above, more of the configuration memory 52 than just the configuration memory 52 pertaining to the detected error may be cleared and rewritten.

As another example, the error may be determined to have occurred in the static region 92. The processor 98 may manage and/or correct errors that occur in the static region 92. For instance, the processor 98 may determine whether to stop (e.g., deactivate) the static region 92 and the partial reconfiguration regions 94, and scrub the error and perform a logical reset after scrubbing is completed. Additionally, the processor 98 may reboot the integrated circuit 12. In other words, the processor 98 may deactivate the integrated circuit 12, clear the data stored on the configuration memory 52 (including the configuration memory 52 that corresponds to the static region 92 and the partial reconfiguration regions 94), rewrite the data onto the configuration memory 52, and reactivate the integrated circuit 12. It should be noted that the processor 98 may determine whether to perform a reset or a reboot based on an error tolerance associated with a particular part of the configuration memory 52. For instance, certain CRAM cells of the configuration memory 52 may be classified (e.g., set via user input) as being tolerant or intolerant of errors (e.g., SEUs). The processor 98 may determine whether the error tolerance of the location (e.g., a particular CRAM cell) of the error and perform a reset of reboot based on the error tolerance. The error tolerance may be binary in nature. For example, when the processor 98 determines that the error corresponds to memory that is error intolerant, a reboot may be performed, and when the processor 98 determines that the error corresponds to memory that is error tolerant, a reset may be performed.

In some embodiments, the static region 92 and/or one or more of the partial reconfiguration regions 94 may be protected by redundant logic, such as dual-modular-redundancy or triple-modular redundancy. In instances in which an error occurs in a region that is protected by redundant logic, the error may be corrected via scrubbing alone because the probability of errors occurring in the same location on redundant copies of the effected region within the period of time it takes to perform scrubbing is very low, such as statistically zero. In other words, errors in regions protected by redundant logic may be corrected without performing a reset or reboot.

Furthermore, while several corrective operations have been described above, it should be noted that other additional actions may be performed. For example, in some embodiments, an error may be scrubbed and data, such as statistics, may be cleared.

Figure 6:
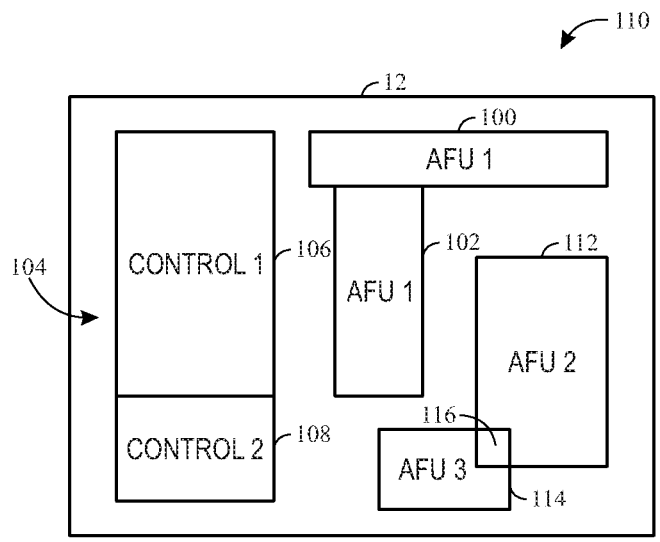
FIG. 6 is a block diagram of an integrated circuit, in accordance with an embodiment of the present disclosure.

Moreover, while each of the partial reconfiguration regions 94 in the illustrated embodiment corresponds to a separate function and/or program (bitstream) 18 (e.g., AFU 1, AFU 2, and AFU 3), multiple regions may correspond to the same function and/or program (bitstream) 18. Additionally, while the regions of the illustrated embodiment are shown as separate (i.e., isolated from one another), in other embodiments, the regions may overlap. For example, FIG. 6 is a block diagram of an embodiment of the integrated circuit 12 that includes two regions that correspond to the same program (bitstream) 18 as well as two regions that overlap. For instance, region 100 and region 102 correspond to the same program (bitstream) 18. In other words, multiple shapes defined by multiple sets of coordinates in a floorplan 110 may define an area of the integrated circuit 12 associated with a particular program (bitstream) 18. Additionally, a control region 104 may be subdivided into sub-regions 106 and 108. The sub-region 106 may be a static region, while the sub-region 108 may be a partial reconfiguration region. In other words, regions of the integrated circuit 12 may be subdivided into sub-regions, and the sub-regions may be static regions or partial reconfiguration regions. Errors may be classified as pertaining to the regions 100, 102, 104 and sub-regions 106 and 108 in the same manner as discussed above in relation to FIG. 5. That is, a floorplan 110, which is also represented by FIG. 6, may be utilized to determine whether an error pertains to a region. Detected errors that correspond to the regions 100 and 102 and sub-region 108 may be managed (i.e., corrected) in the same manner as discussed above in relation to FIG. 5 with regard to partial reconfiguration regions (e.g., partial reconfiguration regions 94), and detected errors that correspond to the sub-region 106 may be managed in the same manner as discussed above with regard to static regions (e.g., static region 92).

Additionally, as mentioned above and shown in the illustrated embodiment of FIG. 6, regions of the integrated circuit may overlap. For instance, region 112 and region 114 partially overlap (i.e., share a portion of the configuration memory 52), resulting in overlap portion 116. The overlap portion 116 may correspond to a function that is shared between the regions 112 and 114. Errors may be classified as being associated with the regions 112 and 114 and the overlap portion 116 based on the floorplan 110. In the illustrated embodiment, the regions 112 and 114 are partial reconfiguration regions, though in other embodiments, the regions 112 and 114 may be static regions or a combination of static regions and partial reconfiguration regions. In any case, errors that are only in the regions 112 and 114 (i.e., in the region 112 or 114 and not in the overlap portion 116) may be managed as described above. An error in the overlap portion 116 may also be managed. For instance, an error in the overlap portion may be classified as an error that is located in the region 112 and/or the region 114. Instructions executable by the control region 104 or a processor communicatively coupled to the control region 104 may call for determining whether either of the regions 112 and 114 is active. If neither of the regions 112 and 114 is active, the error may be corrected by scrubbing as described above with respect to FIG. 5. However, if either or both of the regions 112 and 114 is active, the error may be corrected via rebooting the regions 112 and/or 114. In other words, regions that overlap to form overlap portions (e.g., overlap portion 116) may allow for functionalities to be shared by multiple regions of the integrated circuit, but may decrease the particularity with which an error may be classified.

Before proceeding to the next drawing, it should be noted that more than two regions may correspond to the same program (bitstream) 18, and such regions may not contact one another. For example, three regions that are completely separated from one another may correspond to the same program (bitstream) 18. Additionally, regions may be subdivided into more than two-subdivisions. Furthermore, more than two regions may overlap, and the integrated circuit may include several overlap portions.

Figure 7:
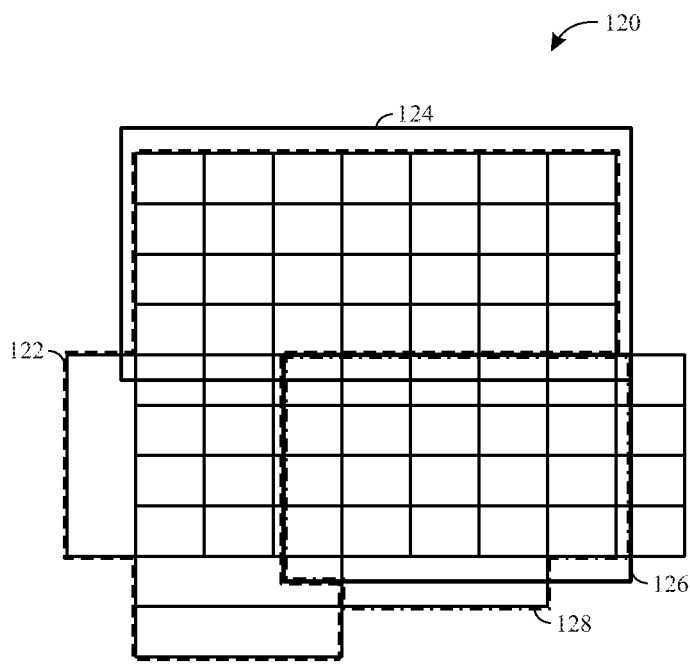
FIG. 7 is a block diagram of a floorplan of an integrated circuit, in accordance with an embodiment of the present disclosure.

FIG. 7 is a block illustration of a floorplan 120 associated with an embodiment of the integrated circuit 12. The floorplan 120 includes regions as the regions may be defined in the configuration memory 52. For instance, a region 122 may include several smaller areas (e.g., rectangle 124) that are defined by coordinates of the floorplan 120. The region 122 may correspond to a program (bitstream) such as program (bitstream) 18. The floorplan 120 also includes the region 126, and the areas of the floorplan 120 that are included in both regions 122 and 126 form an overlap portion 128. As with the regions and overlap region discussed above, errors may be classified as pertaining to the regions 122 and 126 and overlap portion 128, and the errors may be corrected using the techniques described above.

Figure 8:
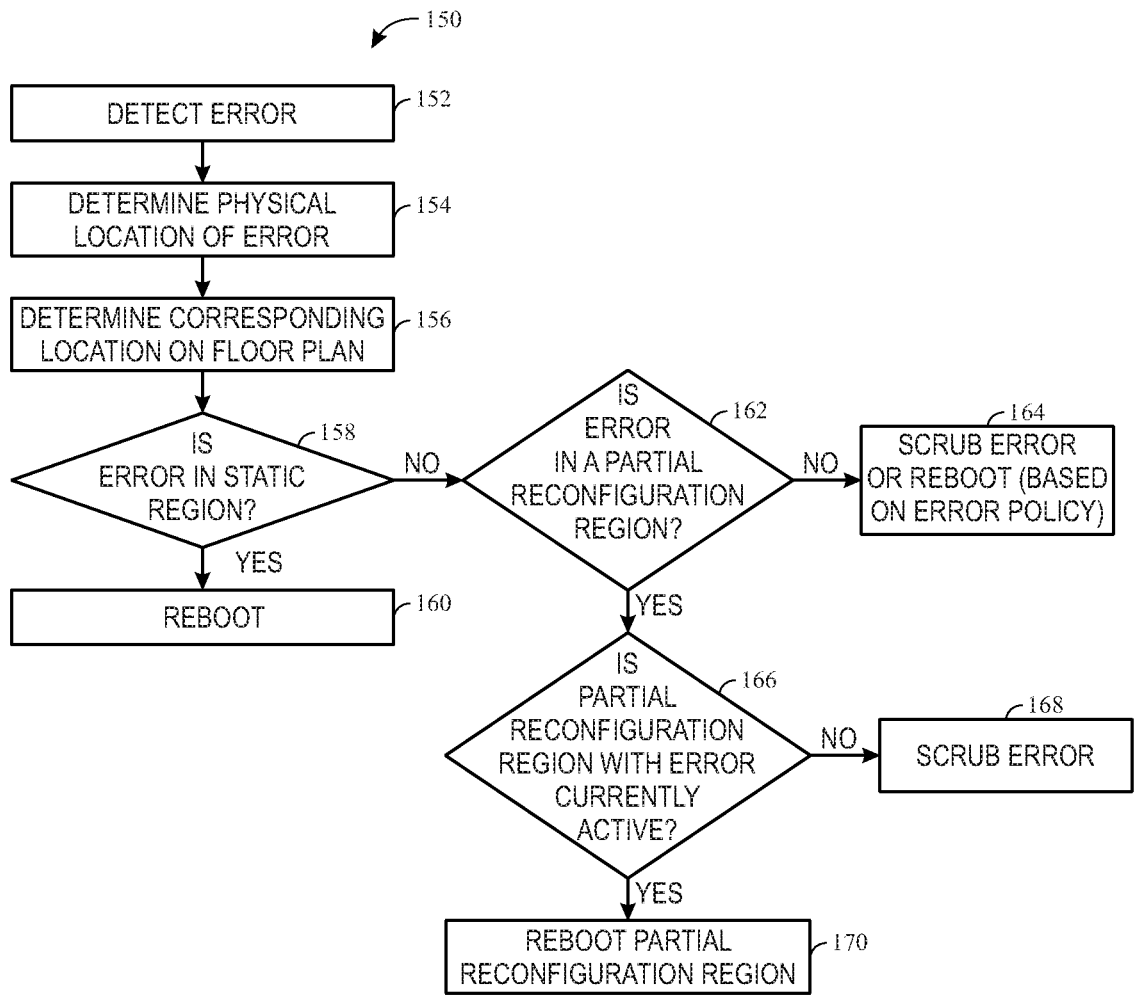
FIG. 8 is a flow chart for classifying and correcting errors associated with an integrated circuit, in accordance with an embodiment of the present disclosure.

Continuing with the drawings, FIG. 8 is a flowchart of a method 150 for classifying and managing an error associated with the integrated circuit 12 using a floorplan (e.g., floorplan 96, 110, or 120). The method 150 may be performed by the integrated circuit 12 as well as systems that include the integrated circuit 12 (e.g., system 91). The method 150 may also be performed by any suitable processor that is configured to execute instructions stored on a non-transitory machine readable medium. Indeed, instructions for the method 150 may be stored on a non-transitory machine readable medium. Moreover, while steps of the method 150 are discussed below in a particular order, it should be noted that the steps may be performed in any suitable order. That is, the method 150 may be performed in an order that differs from the order discussed below.

At block 152, an error may be detected. As described above, an error may correspond to an SEU. Furthermore, as described above with respect to FIG. 4, errors may be detected during cyclic redundancy checks.

At block 154, a physical location of the error in the configuration memory 52 may be determined. For example, as described above, a fault 90 may be detected, and the fault 90 may be indicative of the physical location of the error in the configuration memory 52 (e.g., a specific CRAM cell that includes the error).

At block 156, a location on the floorplan (e.g., floorplan 96, 110, or 120) corresponding to the physical location of the error in the configuration memory 52 may be determined. For example, as discussed above, the floorplan is representative of the integrated circuit 12 and may include sets of coordinates that define regions of the integrated circuit 12. Coordinates (i.e., a location) of the floorplan that correspond to the physical location of the error may be determined.

At block 158, it may be determined whether the error is in a static region (e.g., static region 92). If the error is determined to be in a static region, at block 160, a reboot of the integrated circuit may be performed. As described above, a reboot may entail deactivating the integrated circuit 12, clearing the data stored on the configuration memory 52 (including the configuration memory 52 that corresponds to the static region 92 and the partial reconfiguration regions 94), rewriting the data onto the configuration memory 52, and reactivating the integrated circuit 12. In some embodiments, there may be an additional step between determining that the error is in a static region and rebooting the integrated circuit. For instance, as described above, certain portions of the configuration memory 52 may be classified as being error tolerant or intolerant. Thus, another before rebooting, it may be determined whether the error is associated with a portion of the configuration 52 memory that is error tolerant or intolerant. Upon determination that the error is associated with an error intolerant portion of the configuration memory 52, a reboot of the integrated circuit may be performed, while upon determination that the error is associated with an error tolerant portion of the configuration memory 52 may result in the scrubbing of the error as described above.

It should also be noted that in embodiments in which the static region is protected by redundant logic such as triple-modular redundancy, the error may be corrected without performing a reboot. For example, and as described above, the error may be corrected via scrubbing.

If at block 158 it is determined that the error is not associated with a static region, at block 162, it may be determined whether the error is in a partial reconfiguration region. If the error is determined to not be in a partial reconfiguration region, at block 164, the error may be corrected via scrubbing or performing a reboot of the integrated circuit 12.

If the error is determined to be in a partial reconfiguration region, at block 166, it may be determined whether the partial reconfiguration with which the error is associated is active. If the partial reconfiguration region associated with the error is determined to not be active, at block 168, the error may be corrected via scrubbing. If, however, the partial reconfiguration region associated with the error is determined to be active, at block 170, the error may be corrected via rebooting the partial configuration region.

It should be noted that the method 150 may also include determining whether the error is associated with an overlap portion. As discussed above, an overlap portion occurs when two or more regions of the integrated circuit 12 may each utilize the same portion of the configuration memory 52 of the integrated circuit 12. When the error is associated with an overlap portion, as discussed above, it may be determined whether each of the regions that form the overlap portion is active. If each region forming the overlap portion is determined to not be active, the error may be corrected via scrubbing. If one or more of the regions forming the overlap portion are determined to be active, the error may be corrected by rebooting one or more of regions that form the overlap portion.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An integrated circuit comprising configuration memory that defines a circuit design implemented by the integrated circuit, wherein the circuit design comprises a plurality of regions, wherein the integrated circuit is configured to:

determine a physical location of an error in the configuration memory;

determine a location in a floorplan of the configuration memory that corresponds to the physical location of the error in the configuration memory, wherein the floorplan of the configuration memory identifies where the plurality of regions of the circuit design are defined in the configuration memory;

determine in which of the plurality of regions of the circuit design the error in the configuration memory has occurred based at least in part on the location in the floorplan; and perform a corrective operation based at least in part on which of the plurality of regions of the circuit design the error in the configuration memory has occurred, wherein the corrective operation comprises scrubbing the error or rebooting at least a portion of the integrated circuit.

2. The integrated circuit of claim 1, wherein the integrated circuit comprises a field programmable gate array (FPGA).

3. The integrated circuit of claim 1, wherein the error in the configuration memory has occurred in a first region of the plurality of regions, wherein the first region corresponds to a static region, wherein the corrective operation comprises scrubbing the error or rebooting the integrated circuit.

4. The integrated circuit of claim 1, wherein the plurality of regions comprises a first region of the plurality of regions, wherein the first region corresponds to a partial reconfiguration region, wherein the corrective operation comprises scrubbing the error or rebooting the first region.

5. The integrated circuit of claim 1, wherein the plurality of regions comprises a second region, wherein a first portion of the first region at least partially overlaps with a second portion of the second region, wherein the error has occurred in the first portion, wherein the corrective operation comprises scrubbing the error or rebooting at least one of the first and second regions.

6. The integrated circuit of claim 1, wherein the floorplan is stored within the configuration memory.

7. The integrated circuit of claim 1, wherein the error is due to a single event upset.

8. The integrated circuit of claim 1, wherein the integrated circuit is configured to:
determine whether the location in the floorplan corresponds to a first region of the plurality of regions;
determine whether the first region is active; and
perform the corrective operation based on whether the first region is active.

9. The integrated circuit of claim 1, wherein the plurality of regions is defined within the floorplan via a plurality of coordinates.

10. A non-transitory machine-readable medium comprising instructions configured to cause a system that comprises an integrated circuit and a processor to:
determine a physical location of an error associated with configuration memory of the integrated circuit, wherein the configuration memory defines a circuit design implemented by the integrated circuit;
determine a location on a floorplan of the circuit design that corresponds to the physical location of the error, wherein the floorplan is representative of the configuration memory;
determine a region of a plurality of regions of the configuration memory to which the location in the floorplan corresponds; and
cause the error to be corrected differently based at least in part on the region, wherein the error is corrected by causing a portion of the configuration memory to be restored or causing at least a portion of the integrated circuit to be rebooted.

11. The non-transitory machine-readable medium of claim 10, wherein the instructions are configured to cause the system to determine whether the location in the floorplan corresponds to a static region or a partial reconfiguration region.

12. The non-transitory machine-readable medium of claim 10, wherein the instructions are configured to cause the system to:
determine whether the region is actively in use; and
cause the system to correct the error based on whether the region is actively in use.

13. The non-transitory machine-readable medium of claim 10, wherein the region is programmed or designed by a maker of the integrated circuit, a user of the integrated circuit, a third party, or a combination thereof.

14. The non-transitory machine-readable medium of claim 10, wherein the plurality of regions comprises a second region, wherein the region and the second region form an overlap portion, wherein the instructions are configured to cause the system to determine whether the error is associated with the overlap portion.

15. The non-transitory machine-readable medium of claim 10, wherein the instructions are configured to cause the system to correct the error by restoring the portion of the configuration memory.

16. A system comprising:
an integrated circuit comprising configuration memory, wherein the integrated circuit is configured to implement a circuit design based on the configuration memory, wherein the configuration memory comprises a plurality of regions; and
a processor communicatively coupled to the integrated circuit, wherein a controller of the integrated circuit, the processor, or both is configured to:
determine a physical location of an error in the configuration memory;
determine a location in a floorplan of the configuration memory that corresponds to the physical location of the error in the configuration memory, wherein the floorplan of the configuration memory is indicative of where the plurality of regions of the circuit design are defined in the configuration memory; and
perform a corrective operation based at least in part on the location in the floorplan, wherein the corrective operation comprises restoring at least a portion of the configuration memory or rebooting at least a portion of the integrated circuit.

17. The system of claim 16, wherein the processor is configured to run a compiler, wherein the compiler is configured to generate the floorplan and a program comprising instructions associated with the circuit design.

18. The system of claim 16, wherein the error corresponds to a first region of the plurality of regions, and wherein the controller is configured to perform the corrective operation based on an error tolerance associated with the first region.

19. The system of claim 16, wherein the error corresponds to a first region of the plurality of regions, wherein the controller is configured to perform the corrective operation based on whether the first region is protected by redundant logic.

20. The system of claim 16, wherein the floorplan is stored on fifty kilobytes or less of the configuration memory.

* * * * *